(12) United States Patent
Dong

(10) Patent No.: US 8,343,846 B2
(45) Date of Patent: Jan. 1, 2013

(54) METHOD OF FORMING ISOLATION LAYER IN SEMICONDUCTOR DEVICE

(76) Inventor: Cha Deok Dong, Icheon-si (KR)

( * ) Notice: Subject to any disclaimer, the term of this patent is extended or adjusted under 35 U.S.C. 154(b) by 497 days.

(21) Appl. No.: 12/131,229

(22) Filed: Jun. 2, 2008

(65) Prior Publication Data

US 2009/0170282 A1    Jul. 2, 2009

(30) Foreign Application Priority Data

Dec. 28, 2007  (KR) .................. 10-2007-0140317

(51) Int. Cl.
   *H01L 21/76* (2006.01)
(52) U.S. Cl. ......... 438/400; 438/424; 438/437; 438/443
(58) Field of Classification Search .................. 438/400, 438/424, 437, 443
   See application file for complete search history.

(56) References Cited

U.S. PATENT DOCUMENTS

| 7,105,397 | B2* | 9/2006 | Hieda et al. .................. 438/207 |
| 8,119,538 | B1* | 2/2012 | Byun et al. ..................... 438/770 |
| 2003/0143852 | A1* | 7/2003 | En-Ho et al. .................. 438/694 |
| 2005/0258463 | A1* | 11/2005 | Yaegashi et al. ............... 257/296 |
| 2007/0066076 | A1* | 3/2007 | Bailey et al. ................... 438/710 |
| 2007/0145456 | A1* | 6/2007 | Lee ................................. 257/314 |
| 2008/0003773 | A1* | 1/2008 | Kwak et al. .................... 438/425 |
| 2008/0233731 | A1* | 9/2008 | Lin et al. ........................ 438/597 |

FOREIGN PATENT DOCUMENTS

| KR | 1020040053440 A | 6/2004 |
| KR | 10-2006-0066395 | 6/2006 |
| KR | 10-2006-0076517 | 7/2006 |

* cited by examiner

*Primary Examiner* — Jae Lee
(74) *Attorney, Agent, or Firm* — Marshall, Gerstein & Borun LLP

(57) ABSTRACT

A method of forming isolation layer in a semiconductor device, comprising forming a trench on an isolation region of a semiconductor substrate by etching utilizing an isolation mask; forming a first insulating layer on a lower portion of the trench; forming a second insulating layer on the semiconductor substrate including the first insulating layer; etching the second insulating layer to increase an aspect ratio on the isolation region; and forming a third insulating layer on a peripheral region of the second insulating layer to fill moats formed on the second insulating layer with the third insulating layer.

27 Claims, 7 Drawing Sheets

METHOD OF FORMING ISOLATION LAYER IN SEMICONDUCTOR DEVICE

CROSS-REFERENCE TO RELATED APPLICATION

Priority to Korean Patent Application No. 10-2007-0140317, filed on Dec. 28, 2007, the disclosure of which is incorporated herein by reference in its entirety, is claimed.

BACKGROUND OF THE INVENTION

The present invention relates to a method of forming an isolation layer in a semiconductor device and, more particularly, to a method of forming an isolation layer in a semiconductor device, wherein moats caused by a high density plasma (HDP) deposition characteristic are filled to eliminate a factor causing a generation of subsequent voids.

As semiconductor devices become more highly-integrated, processes for forming isolation layers become more difficult. Accordingly, an isolation layer is formed by means of a STI (shallow trench isolation) method in which a trench is formed on a semiconductor substrate and the trench is then filled. In the meantime, in the various STI methods, the method in which a tunnel insulating layer, a polysilicon layer, and a hard mask layer are laminated on a semiconductor substrate, are then sequentially etched to form a trench, and an oxide layer is formed on an overall structure to fill the trench, have been applied to semiconductor devices, such as NAND-type flash memory devices. In highly-integrated devices, however, as compared with a width of entrance of the trench, the depth of the trench is large, and it is thus more difficult to completely gap-fill the trench with a conventional high density plasma (HDP) oxide layer without generating voids due to the large aspect ratio, thus making it difficult to form an isolation layer. In order to solve the above problem, research in the material used for gap-filling the trench without generating voids has been actively conducted.

As one of the methods conceived to solve the above problem, the method in which a trench is completely gap-filled by means of polysilazane (PSZ), which is a spin on dielectric (SOD) material has been employed. In this method, PSZ-based material having sufficient flowability, being capable of filling a narrow trench, is applied and deposited to form an oxide layer. The oxide layer is then cured and planarized by a chemical mechanical polishing (CMP) process.

However, since polysilazane (PSZ) material typically contains a large quantity of impurities and moisture, the isolation layer formed from only polysilazane (PSZ) material is favorable to a gap-fill, but tends to be detrimental to the reliability of the device. Accordingly, a wet etch back process is performed to reduce the thickness of the polysilazane (PSZ) layer to secure a subsequent gap-fill margin, and a high density plasma (HDP) oxide layer with a certain thickness is then formed. However, due to a characteristic of the process for forming the high density plasma (HDP) oxide layer, on the remainder of the semiconductor substrate except a central region, the high density plasma (HDP) oxide layer is thinly formed on a side wall of a trench adjacent to an edge region, and so a moat is generated by the above asymmetrical deposition. After the high density plasma (HDP) oxide layer is formed, a portion of the high density plasma (HDP) oxide layer is etched through a wet etch back process, and the high density plasma (HDP) oxide layer is then additionally and thickly formed. At this time, void is formed generated in a portion on which the moat is formed.

In a case where the void is formed in the oxide layer, in the process for removing an isolation nitride layer performed after a subsequent chemical mechanical polishing (CMP) process performed for forming the isolation layer, a side wall of a conductive layer for a floating gate is exposed by an etchant so that the conductive layer for a floating gate can be severely lost. In this state, if PCL (Peri Close) mask and etching processes for maintaining an effective field height (EFH) of a peripheral region are performed, the conductive layer for a floating gate is partially stripped due to an attack on the conductive layer for a floating gate. This phenomenon reduces an area of the floating gate to decrease a coupling ratio of a cell, so an operation characteristic of the semiconductor device becomes lowered.

SUMMARY OF THE INVENTION

The present invention relates to a method of forming an isolation layer in a semiconductor device, in which a moat caused by a high density plasma deposition characteristic is effectively filled with an oxide layer preferably formed by a low pressure chemical vapor deposition method to eliminate a factor causing generation of voids in advance, whereby generation of voids can be inhibited during a subsequent deposition process to prevent a loss of a side wall of a conductive layer for a gate when a subsequent wet etching process is performed.

The method of forming an isolation layer in a semiconductor device according to one embodiment of the present invention comprises forming a trench on an isolation region of a semiconductor substrate through an etching process utilizing an isolation mask; forming a first insulating layer on a lower portion of the trench; forming a second insulating layer on the semiconductor substrate including the first insulating layer; performing an etching process to the second insulating layer to increase an aspect ratio of the isolation region; and forming a third insulating layer on a peripheral region of the second insulating layer to fill moats formed on the second insulating layer with the third insulating layer.

The second insulating layer is preferably formed of a high density plasma (HDP) oxide layer. The etching process is preferably a wet etch-back process. In addition, the second insulating layer is preferably formed such that a thickness of the second insulating layer formed on a side wall of the trench adjacent to an edge region is smaller than that of the second insulating layer formed on a central region of the semiconductor substrate, whereby the second insulating layer is preferably inclined and asymmetrically formed.

The third insulating layer is preferably formed of an oxide layer, preferably formed by a low pressure chemical vapor deposition method, and the oxide layer preferably formed by a low pressure chemical vapor deposition method is preferably formed of a high temperature oxide (HTO) layer or a tetra ethyl ortho silicate (TEOS) layer. Also, the third insulating layer preferably remains in the form of a spacer on side walls of the conductive layer formed on an active area of the semiconductor substrate.

Forming the third insulating layer preferably comprises forming the third insulating layer on the two insulating layer through a low pressure chemical vapor deposition method to fill the moats formed on the second insulating layer with the third insulating layer; and performing an etching process for the third insulating layer to make the third insulating layer remain in the form of a spacer.

The first insulating layer is preferably formed of a stack layer comprising a high density plasma (HDP) oxide layer and a polysilazane (PSZ) layer. In the meantime, the first insulating layer is preferably formed of a stack layer comprising a high temperature oxide (HTO) layer and a polysilazane (PSZ) layer.

Forming the first insulating layer preferably comprises forming a high density plasma (HDP) oxide layer on the semiconductor substrate including the trench to fill a portion of the trench with the high density plasma (HDP) oxide layer; forming the polysilazane (PSZ) layer on the high density plasma (HDP) oxide layer to fill the trench with the polysilazane (PSZ) layer; performing a planarizing process for making the high density plasma (HDP) oxide layer and the polysilazane (PSZ) layer remain only on the trench region; and performing an etching process to reduce the height of the polysilazane (PSZ) layer.

Forming the first insulating layer preferably comprises forming the high temperature oxide (HTO) layer on the semiconductor substrate including the trench to fill a portion of the trench with the high temperature oxide (HTO) layer; forming the polysilazane (PSZ) layer on the high temperature oxide (HTO) layer to fill the trench with the polysilazane (PSZ) layer; performing a planarizing process for making the high temperature oxide (HTO) layer and the polysilazane (PSZ) layer remain only on the trench region; and performing an etching process to reduce a height of the polysilazane (PSZ) layer.

The polysilazane (PSZ) layer is preferably formed by coating polysilazane (PSZ) material and then curing the applied polysilazane material. The step of curing polysilazane (PSZ) material is preferably performed by a mixed method of a steam annealing and nitrogen ($N_2$) annealing.

The method of the present invention preferably further comprises curing the planarized polysilazane (PSZ) layer before performing the etching process to reduce the height of the polysilazane (PSZ) layer. At this time, curing the planarized polysilazane (PSZ) layer is preferably performed by a mixed method of steam annealing and nitrogen ($N_2$) annealing.

The method of the present invention preferably further comprises performing an etching process for the third insulating layer to secure a space in the trench region after forming the third insulating layer.

The method of the present invention preferably further comprises forming a fourth insulating layer on the semiconductor substrate including the third insulating layer after forming the third insulating layer; performing a planarization process so as to make the third and fourth insulating layers remain only on a region on which the trench is formed, thereby forming an isolation layer; removing the isolation mask; and performing an etching process for the isolation layer to adjust the effective field height (EFH).

When the isolation mask is removed, the third insulating layer preferably remains in the form of a spacer on a side wall of the conductive layer formed on an active area of the semiconductor substrate to protect the side wall of the conductive layer.

The method of forming an isolation layer in a semiconductor device according to another embodiment of the present invention preferably comprises providing a semiconductor substrate in which a trench is formed on an isolation region and a multi-layered layer including a tunnel insulating layer and a conductive layer is formed on an active region; forming a first insulating layer on a lower portion of the trench; forming a second insulating layer on the semiconductor substrate including the first insulating layer; carrying out an etching process to the second insulating layer to increase an aspect ratio on the isolation region; and forming a third insulating layer on a peripheral region of the second insulating layer to fill moats formed on the second insulating layer with the third insulating layer.

In the above method, the third insulating layer is preferably formed of an oxide layer, preferably formed through a low pressure chemical vapor deposition method. In addition, the oxide layer formed by a low pressure chemical vapor deposition method is preferably formed of a high temperature oxide (HTO) layer or a tetra ethyl ortho silicate (TEOS) layer.

When the isolation mask is removed, the third insulating layer preferably remains in the form of a spacer on a side wall of the conductive layer to protect the side wall of the conductive layer.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF SPECIFIC EMBODIMENTS

Hereinafter, preferred embodiments of the present invention are explained in more detail with reference to the accompanying drawings. However, the embodiments of the present invention can be variously modified, and the scope of the present invention is not limited to the embodiments described herein, which are provided to explain the invention to those skilled in the art.

Figure 1A:
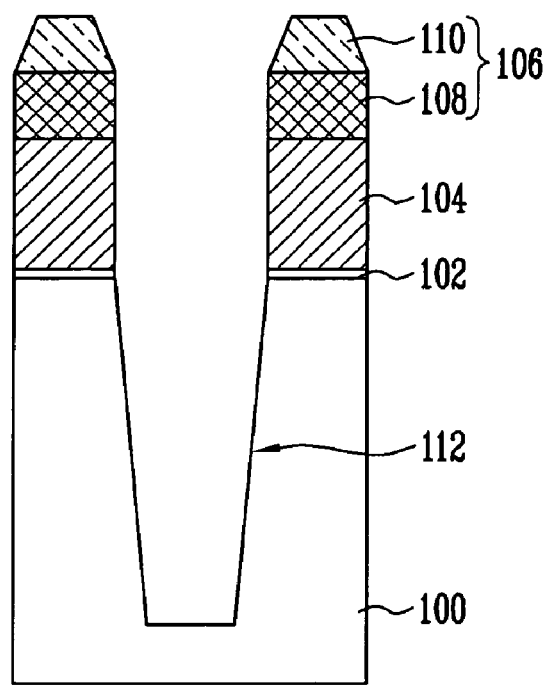
FIG. 1A to FIG. 1N are cross-sectional views of the semiconductor device for illustrating a method of forming an isolation layer in a flash memory device according to one embodiment of the present invention.
Figure 1B:
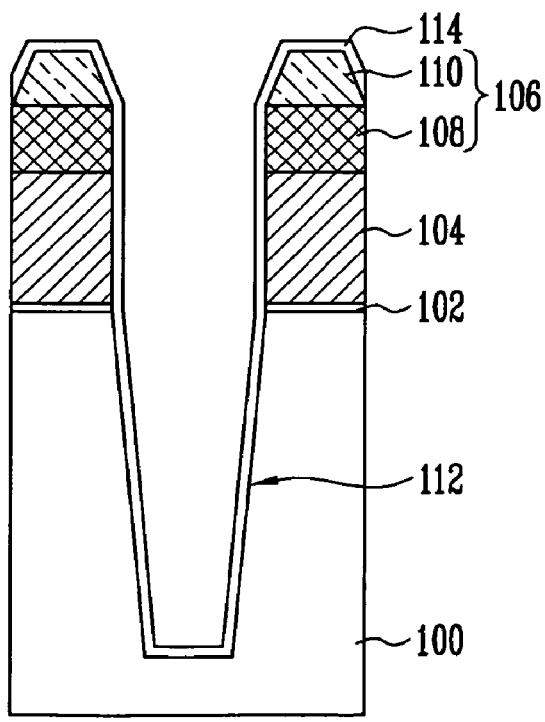
Figure 1C:
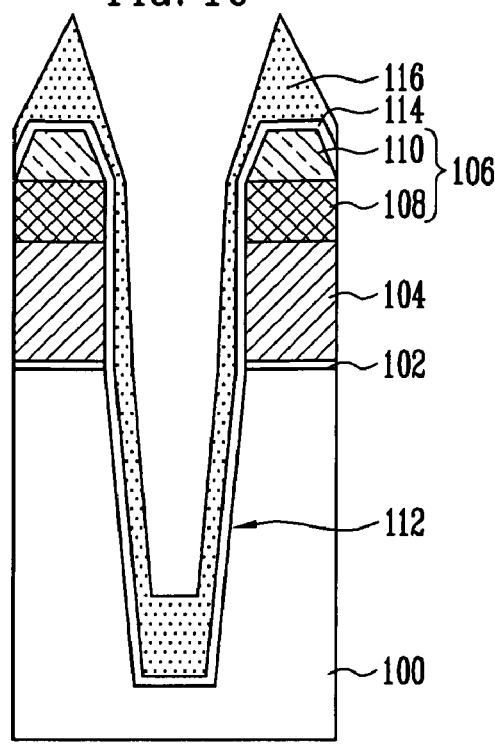
Figure 1D:
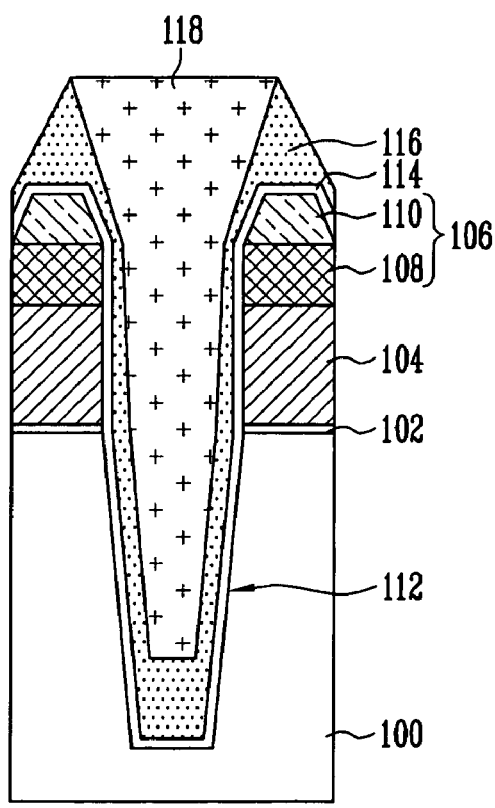
Figure 1E:
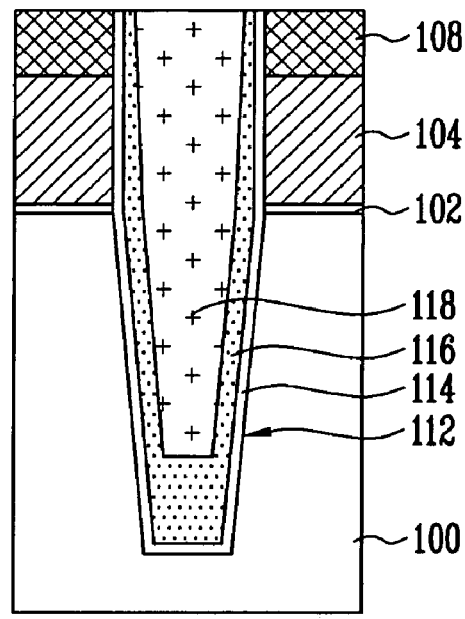
Figure 1F:
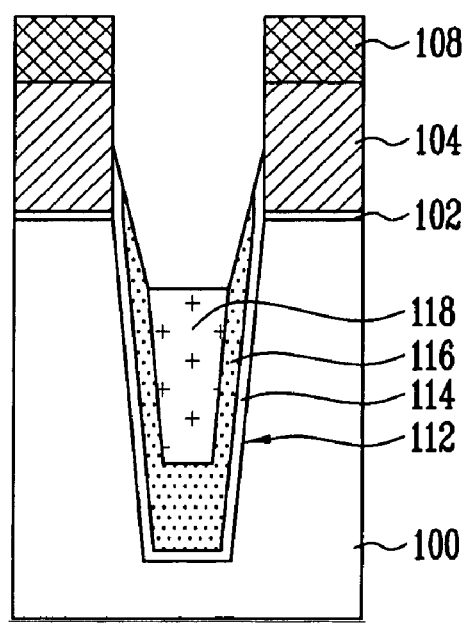
Figure 1G:
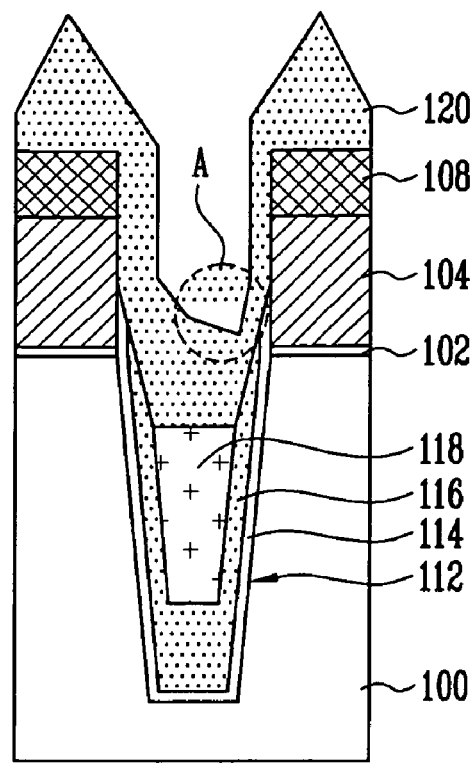
Figure 1H:
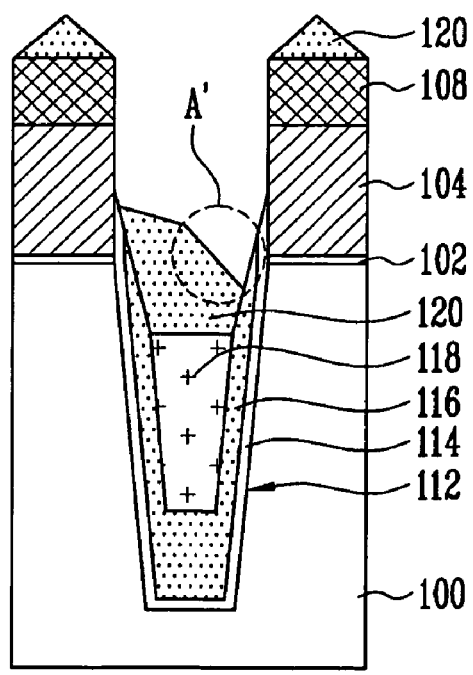
Figure 1I:
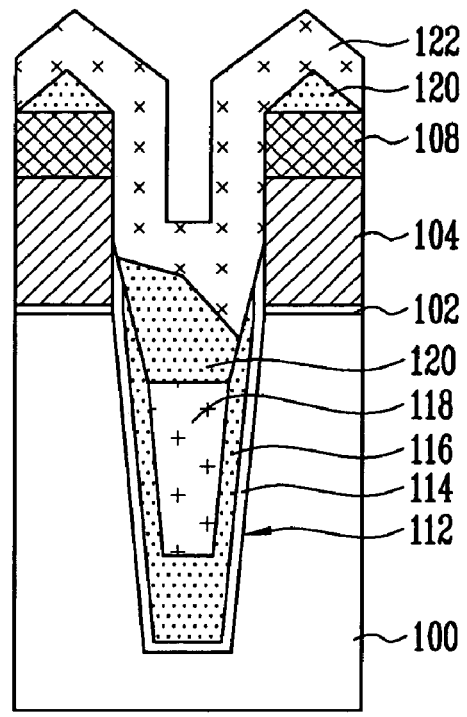
Figure 1J:
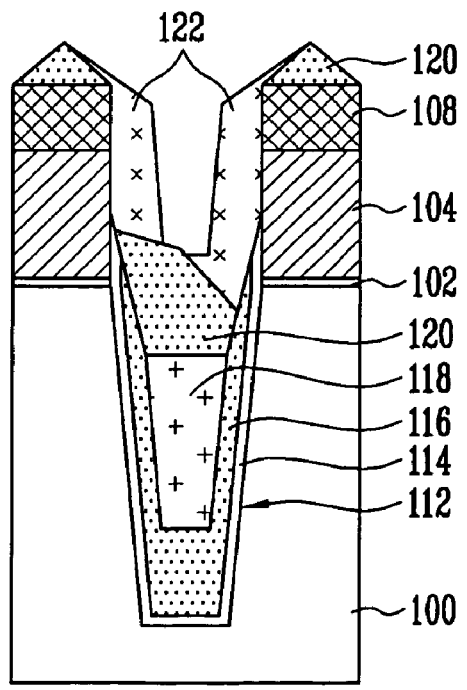
Figure 1K:
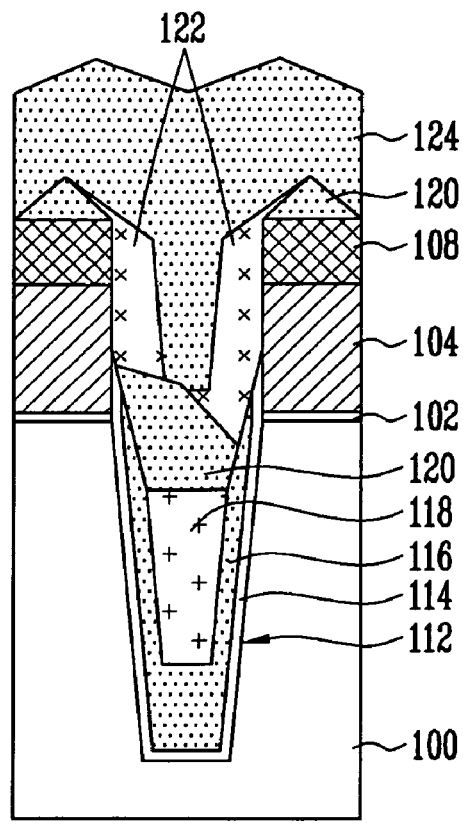
Figure 1L:
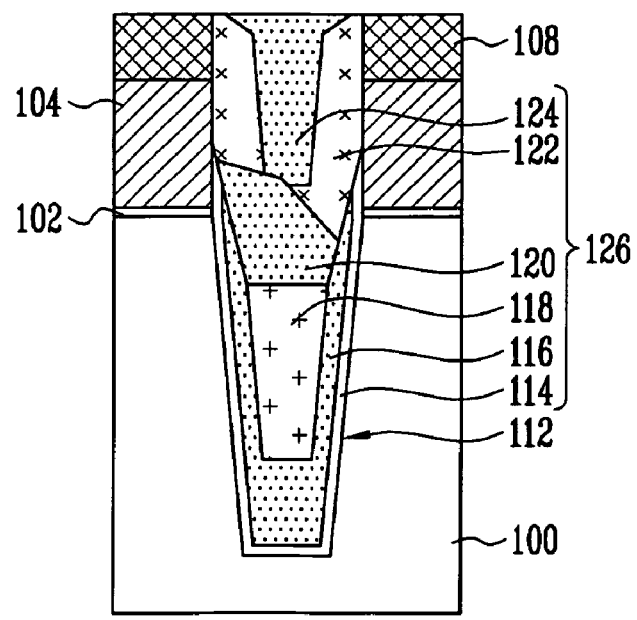
Figure 1M:
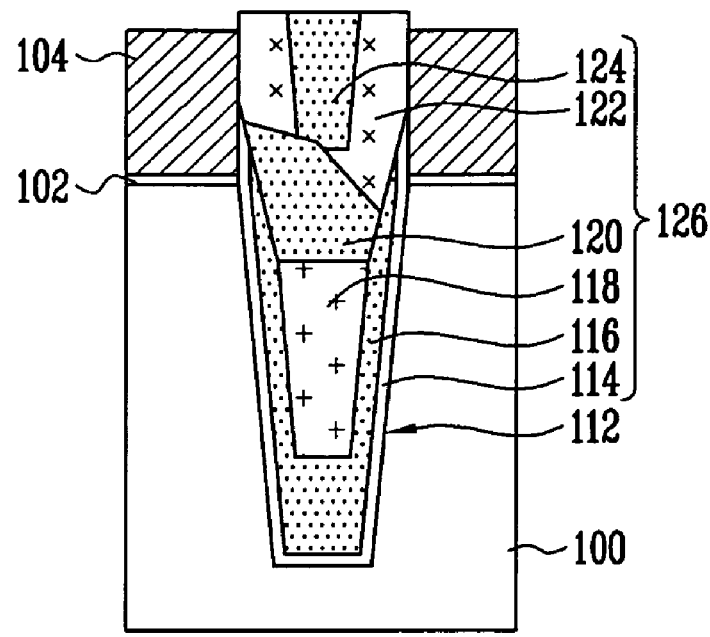
Figure 1N:
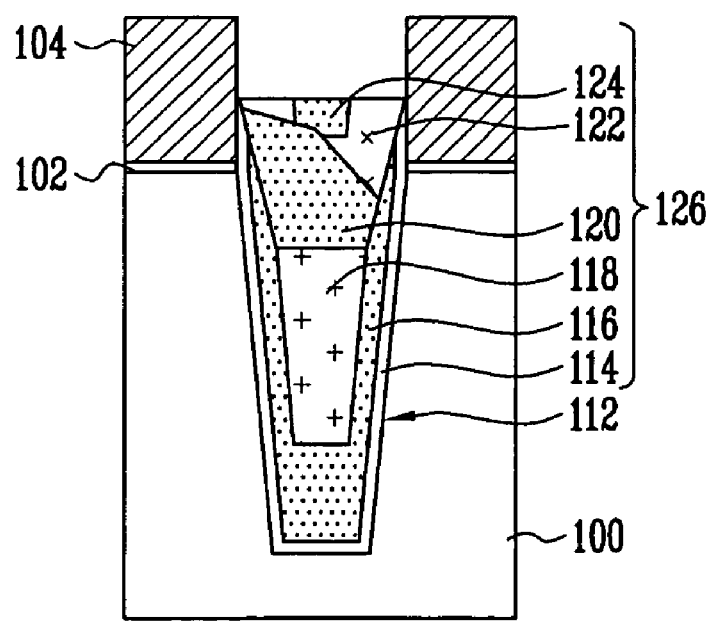

FIG. 1A to FIG. 1N are cross-sectional views of a semiconductor device illustrating a method of forming an isolation layer in a flash memory device according to one embodiment of the present invention.

Referring to FIG. 1A, a tunnel insulating layer 102, a conductive layer 104, and an isolation mask 106 are sequentially formed on a semiconductor substrate 100. The tunnel insulating layer 102 is illustratively formed of a silicon oxide ($SiO_2$) layer. In this case, the tunnel insulating layer can be formed through an oxidation process. In a process for manufacturing a dynamic random access memory (DRAM), the tunnel insulating layer 102 is a gate insulating layer. The conductive layer 104 is used as a floating gate of a flash memory device, and is illustratively formed of a polysilicon layer, a metal layer, or a stack layer of a polysilicon layer and a metal layer. In a process of manufacturing the dynamic random access (DRAM) device, the conductive layer 104 is an element used as a gate electrode. Preferably, to a reduce a concentration of impurities (for example, phosphorus (P)) on an interface between the tunnel insulating layer 102 and a floating gate (not shown) formed later, the conductive layer 104 has a stack structure of an undoped polysilicon layer and a doped polysilicon layer, and is preferably formed by either an in-situ process or an ex-situ process.

The isolation mask 106 is used as an etching mask in a subsequent process for forming a trench, and for preventing a loss of the conductive layer 104. The isolation layer may have a stack structure comprising a buffer oxide layer (not shown), an isolation nitride layer 108, and a hard mask layer 110. At this time, the buffer oxide layer may not be formed in the above stack structure, and the isolation nitride layer 108 is formed from nitride-based material to use the isolation nitride layer as a polishing-stop layer in a subsequent chemical mechanical polishing (CMP) process performed for forming an isolation layer. In addition, the hard mask layer 110 may be formed from oxide, nitride, silicon oxide nitride (SiON), or amorphous carbon, for example.

Subsequently, the isolation mask 106, the conductive layer 104, the tunnel insulating layer 102, and a portion of the semiconductor substrate 100 on an isolation area are etched to form a trench 112. This process is illustrated below in more detail. Photoresist (not shown) is applied on the isolation mask 106, and an exposure process and a developing process are then performed to form photoresist patterns (not shown) through which the isolation mask 106 of the isolation area is exposed. Subsequently, the isolation mask 106 is etched through an etching process using the photoresist patterns. Then, the photoresist patterns are removed. Continuously, the conductive layer 104 and the tunnel insulating layer 102 are etched through an etching process using the isolation mask 106. From this, the isolation area of the semiconductor substrate 100 is exposed. In the process for etching the isolation mask 106, the conductive layer 104, and the tunnel insulation layer 102, the hard mask layer 110 of the isolation mask 106 is also etched to a certain thickness. Subsequently, the semiconductor substrate 100 of the exposed isolation area is etched to a certain thickness. From this, the trench 112 is formed on the isolation area. As described above, it is preferable to form the trench 112 by an advanced self align-shallow trench isolation (ASA-STI) process performed on the semiconductor substrate 100.

Referring to FIG. 1B, to compensate for damage caused by the etching process performed for forming the trench 112, a wall oxidation process may be further be carried out. To promote an oxidation of the isolation mask 106 and minimize a smiling phenomenon generated at both ends of the tunnel insulating layer 102, at this time, it is preferable that a radical oxidation process is performed as the wall oxidation process.

From this, a side wall and a bottom surface of the trench 112 as well as the exposed tunnel insulating layer 102, the conductive layer 104, and the isolation mask 106 are oxidized to a certain thickness through the radical oxidation process, and so an etching-damaged layer (not shown) is formed as a side wall oxide layer 114.

Referring to FIG. 1C, a first insulating layer 116 is formed in the form of a liner on the side wall oxide layer 114 to fill a portion of the trench 112. The first insulating layer 116 should be formed from material having a verified reliability to prevent the tunnel insulating layer 102 from being thermal-degraded by a penetration and a dose ion movement of $H_2$ or $SiH_2$, which is out-gassed during a process for curing a polysilalzane (PSZ) layer formed later. And, in order to prevent a side wall of the conductive layer 104 from losing during a subsequent wet etching process performed for the purpose of securing a gap-fill margin and an etching selection ratio, the liner shaped first insulating layer is formed from material having an etching selection ratio higher than that of the polysilalzane (PSZ) layer.

To achieve the above structure, it is preferable that the first insulating layer 116 is formed of a high density plasma (HDP) oxide layer formed through a high density plasma (HDP) manner and having an etching selection ratio larger than six to ten times that of the polysilazane (PSZ) layer or a high temperature oxide (HTO) oxide layer formed through a low pressure chemical vapor deposition (LPCVD) manner. At this time, the first insulating layer 116 may be formed with a thickness of 150 Å to 1,500 Å so as to enable a contact between the polysilalzane (PSZ) layer containing much impurities and formed subsequently and the tunnel insulating layer 102 to be inhibited, if possible. FIG. 1C shows and illustrates that the high density plasma (HDP) oxide layer is formed as the first insulating layer 116.

Generally, if the first insulating layer 116 is formed of the high density plasma (HDP) oxide layer, due to a characteristic of the high density plasma (HDP) deposition method, a thickness of the first insulating layer formed on a side wall of the trench 112 near the edge of an rest area of the semiconductor substrate 100 except an central area is lowered so that the first insulating layer 116 is inclined when formed. That is, when the high density plasma (HDP) deposition process is performed, since source gas is supplied from a center of an upper portion above the semiconductor substrate 100 through a shower head, a flow direction of silicon dioxide ($SiO_2$) is gradually inclined toward an edge of the semiconductor substrate so that the silicon dioxide flows in an inclined manner into the trench 112. As a result, an asymmetrical unbalanced deposition is achieved in the trench.

Due to the above unbalanced deposition in the trench, the first insulating layer 116 formed on a side wall of the trench 112, the tunnel insulating layer 102, the conductive layer 104, and a side wall of the isolation mask 106 is thicker than that formed on a bottom surface of the trench 112 and the active area of the semiconductor substrate.

However, like the first insulating layer 116, if a thickness of the high density plasma (HDP) oxide layer is thin, the above-mentioned phenomenon does appear hardly.

Referring to FIG. 1D, insulating material is deposited on the first insulating layer 116 including the trench 112 so as to fill the trench 112, and so a second insulating layer 118 is formed. The second insulating layer 118 preferably comprises a spin on dielectric (SOD) layer having the best filling characteristic for the trench 112, resulting from the material's excellent flowability. In order to form the SOD insulating layer, at this time, polysilazane-based material can be used. Accordingly, the SOD insulating layer preferably comprises a polysilazane (PSZ) layer.

In a case where the second insulating layer 118 is formed of the polysilazane (PSZ) layer, polysilazane material is preferably deposited by a spin coating method and a curing process is then performed to form the polysilazane layer. Polysilazane material has a flowability due to its low viscosity so that the trench 112 can be filled with polysilazane material without generating voids when a process for coating polysilazane material is carried out.

The above curing process is performed by a mixed method of a steam annealing method and a nitrogen ($N_2$) annealing method, and is performed such that an additional smiling phenomenon of the tunnel insulating layer 102 is prevented. During the curing process, nitrogen (N) is eliminated from polysilazane (PSZ) material containing silicon (Si), hydrogen (H), and nitrogen (N), and hydrogen (H) is substituted by oxygen ($O_2$), thereby forming a solidified polysilazane (PSZ) layer comprising a silicon oxide ($SiO_2$).

As compared with the high density plasma (HDP) oxide layer, the polysilazane (PSZ) layer has excellent filling characteristics. However, since an etching ratio of the polysilazane (PSZ) layer to wet etchant is large, if the polysilazane (PSZ) layer is exposed to wet etchant in a subsequent process, the polysilazane (PSZ) layer is rapidly removed to cause a problem of the device. Accordingly, there is need to reduce a thickness of the polysilazane (PSZ) layer so as to inhibit the polysilazane (PSZ) layer from being exposed in a subsequent process, as illustrated below.

Referring to FIG. 1E, a process for planarizing the second insulating layer 118 is performed to remove the side wall oxide layer 114, the first insulating layer 116, and the second insulating layer 118 formed on an area except on an area on which the trench 112 is formed. Preferably, the planarization process is performed by a chemical mechanical polishing (CMP) process and the etching process is carried out until the isolation nitride layer 108 of the isolation mask 106 is exposed.

After a planarization process for the second insulating layer 118 is performed, in the meantime, a curing process can be further performed for enhancing the density of the second insulating layer 118 to reduce an etch rate of the second insulating layer 118 to a controllable level. At this time, the curing process can be performed by a mixed method of low-temperature steam annealing and high-temperature nitrogen ($N_2$) annealing, although the curing process can be performed by another method, if desired.

Referring to FIG. 1F, an etching process for reducing the thickness of the second insulating layer 118 is performed. The illustrated etching process is a wet etching process. Preferably, a wet etch-back process can be performed as the above etching process. As etchant used in the wet etch-back process, buffered oxide etchant (BOE) or hydro fluoride (HF) is preferably utilized. For purpose of securing a gap fill margin and an etching selection ratio, at this time, a process time for the wet etch-back process is appropriately adjusted to lower the second insulating layer 118 below a surface of the semiconductor substrate 100 of the active area.

Accordingly, the second insulating layer 118 having an etching ratio larger than that of the first insulating layer 116 is rapidly etched so that a thickness of the second insulating layer 118 is reduced to secure a gap fill margin in a subsequent deposition process. At this time, the first insulating layer 116 having an etching ratio smaller than that of the second insulating layer 118 is formed on side walls of the tunnel insulating layer 102, and so the tunnel insulating layer 102 is not exposed, but is protected by the first insulating layer 116 during a process for etching the second insulating layer 118. In process of etching the second insulating layer 118, the first insulating layer 116 as well as the side wall oxide layer 114 are etched to allow a portion of the side wall of the conductive layer 104 to be exposed.

Referring to FIG. 1G, a third insulating layer 120 is formed in the form of a liner on the isolation nitride layer 108 including the second insulating layer 118. Preferably, the third insulating layer 120 is formed of a high density plasma (HDP) oxide layer and has a thickness of 100 Å to 1,000 Å.

However, in a case where the third insulating layer 120 is formed of a high density plasma (HDP) oxide layer as described above, a thickness of the third insulating layer formed on a side wall of the trench 112 adjacent to an edge on a region except a central portion of the semiconductor substrate 100 becomes small due to a deposition characteristic of the high deposition plasma (HDP) manner, and so the third insulating layer 120 is inclined when formed.

That is, when the high density plasma (HDP) deposition process is performed, since source gas is supplied from a center of an upper portion above the semiconductor substrate 100 through a shower head, a flow direction of silicon dioxide ($SiO_2$) is gradually inclined toward an edge of the semiconductor substrate so that the silicon dioxide is inclinedly flowed into the trench 112. As a result, an asymmetrical unbalanced deposition is achieved in the trench.

Due to the unbalanced deposition, the third insulating layer 120 formed on the tunnel insulating layer 102, the conductive layer 104, and side walls of the isolation nitride layer 108 is thicker than that formed in the trench 112 and on the active area, and the third insulating layer formed on side walls of the conductive layer 104 adjacent to a central portion of the semiconductor substrate 100 is thinner than that formed on side walls of the conductive layer 104 adjacent to an edge region. In addition, a moat A, which is concave in the vertical direction, is formed on one side wall of the conductive layer 104 adjacent to an edge area of the semiconductor substrate 100.

Referring to FIG. 1H, an etching process is performed for etching a portion of the third insulating layer 120 to minimize the insulating layer formed on a side wall of the conductive layer 104. A wet etching process is preferably performed as the above etching process; Highly preferably, a wet etch-back process can be performed as the above etching process. At this time hydrogen fluoride (HF) diluted in a ratio of 500:to 50:1 is preferably used as the etchant in the wet etch-back process.

Due to the above etching process, the third insulating layer 120 formed on the side walls of the conductive layer 104 is removed to expose a portion of the side wall of the conductive layer 104, and the third insulating layer 120 partially remains on the isolation nitride layer 108 of the active area and on the second insulating layer 118 of a region on which the trench 112 is formed. However, a portion on which the moat A (see FIG. 1G) is also etched by etchant during the process for etching the third insulating layer 120, and so the moat A is modified into a moat A' having a profile which is hollowed more concavely than the moat A which is initially formed.

Referring to FIG. 1I, a fourth insulating layer 122 of a periphery of the third insulating layer 120 remains on a region on which the trench 112 is formed, so as to fill the moat A1 with the insulating layer. To effectively fill the moat A', the fourth insulating layer 122 is preferably formed of an oxide layer formed by a chemical vapor deposition (LPCVD) method and, highly preferably, a low pressure chemical vapor deposition (LPCVD) oxide layer formed by a low pressure chemical vapor deposition (LPCVD) method. At this time, if the fourth insulating layer is formed on the LPCVD oxide layer; the fourth oxide layer is preferably formed of a high temperature oxide (HTO) layer or a tetra ethyl ortho silicate (TEOS) layer and the like with a preferred thickness of 50 Å to 200 Å.

The low pressure chemical vapor deposition (LPCVD) oxide layer has a mean filling characteristic. On a portion on which the moat A' (see FIG. 1H) is formed, a thickness of the oxide layer is increased. If the oxide layer has a certain thickness or more and surfaces of two layers formed on side walls of the conductive layer 104 then come into contact with each other, sources supplied to both side walls of the conductive layer meet with each other to obtain an additional effect. As a result, as compared with another region, a deposition ratio on the portion on which the moat is formed is higher. And, a filled portion is planarized by a deposition process which is subsequently continued.

In the low pressure chemical vapor deposition (LPCVD) process, in addition, silicon oxide ($SiO_2$) is obtained through a vapor reaction and silicon oxide ($SiO_2$) is attached on the substrate. Under low pressure, the deposition is guided toward a portion on which Gibbs' free energy is low. That is, a filling of a portion on which the moat is formed and a rounding of an angled portion are achieved by a migration of molecular itself.

Accordingly, the moat A' caused by a deposition characteristic of the high density plasma (HDP) oxide layer is uniformly filled with the fourth insulating layer 122 formed of the low pressure chemical vapor deposition (LPCVD) oxide layer to allow a lower step coverage and a topology to be reduced.

Referring to FIG. 1J, an etching process for remaining the fourth insulating layer in the form of a spacer is carried out. Here, a dry etching process is preferably performed as the etching process. Preferably, a spacer etching process may be performed as the etching process.

By the above spacer etching process, all the horizontal portion of the fourth insulating layer 122 is removed and the vertical portion which is thicker than the horizontal portion is remained so that the fourth insulating layer 122 has a positive slope and remains in the form of a spacer on the conductive layer 104 and on the side wall of the isolation nitride layer 108. In this case, the fourth insulating layer 122 remains in the form of spacer on the side wall of the conductive layer 104 and preferably has a thickness of 30 Å to 150 Å.

At this time, the state where a portion on which the moat A1 is formed is filled with the third insulating layer 120 formed of the high density plasma (HDP) oxide layer is maintained. Accordingly, a factor causing a generation of voids in the subsequent deposition process is eliminated in advance, and a sufficient space and slope can be secured during a subsequent gap fill process to prevent a defect from being generated.

Although not shown in the drawings, in the meantime, after the fourth insulating layer 112 remains in the form of a spacer, a wet dip out process, preferably utilizing BOE or diluted HF can be further performed to secure a sufficient space in the trench, and so a subsequent gap fill margin can be more secured.

Referring to FIG. 1K, a fifth insulating layer 124 is formed on the entire structure including the fourth insulating layer 122 remaining in the form of a spacer. The fifth insulating layer 124 is preferably formed of a high density plasma (HDP) oxide layer.

Referring to FIG. 1I, a planarization process for the third, fourth, and fifth insulating layers 120, 122, and 124 is executed to remove the third, fourth, and fifth insulating layers 120, 122, and 124 formed on an area except an area on which the trench 112 is formed. It is preferable that the planarization process is performed by using the chemical mechanical polishing process and the etching process is performed until the isolation nitride layer 108 is exposed.

As a result, an isolation layer 126 comprising the side wall oxide layer 114 and the first, second, third, fourth, and fifth insulating layers 116, 118, 120, 122, and 124 is formed on an area on which the trench 112 is formed.

As described above, when the isolation layer 126 according to one embodiment of the present invention is formed, the moat A' generated on the third insulating layer 120 by a deposition characteristic of the high deposition plasma deposition process is sufficiently filled with the fourth insulating layer 122 remaining in the form of a spacer to inhibit a generation of voids.

Referring to FIG. 1M, a process for removing the isolation nitride layer 108 is performed. The isolation layer is preferably removed by a wet etching process, highly preferably by a wet dip out process in which hydrogen fluoride (HF) solution and phosphoric acid (H₃PO₄) solution are utilized. By the wet etching process, the isolation nitride layer 108 is selectively removed to expose an upper surface of the conductive layer 104 together with a side wall of the isolation layer 126, and so the isolation layer 126 remains in a protrusion shape. In the etching process for removing the isolation nitride layer 108, however, a portion of the third and fourth insulating layers 122 and 124 is etched so that a height of a protrusion of the isolation layer 126 is lowered.

In the present invention, however, when the isolation layer 126 is formed, generation of voids is inhibited so that a side wall of the conductive layer 104 is not exposed by a loss of the isolation layer 126 in the process of removing the isolation nitride layer 108. As a result, an attack against the side wall of the conductive layer 104 is prevented so that a loss of the side wall of the conductive layer 104 is prevented.

If a loss of a side wall of the conductive layer 104 is prevented as described above, an area of the conductive layer 104 is not reduced to prevent a cell coupling ratio from being lowered. Accordingly, it is possible to prevent desirable characteristics of the device from being adversely affected.

Referring to FIG. 1N, an etching process for controlling the effective field height (EFH) of the isolation layer 126 in the cell region is performed. Here, an etchant solution preferably containing HF is utilized in the etching process, and an upper portion of the isolation layer 126 is etched to a certain thickness in the etching process. By the etching process, an upper side wall of the conductive layer 104 becomes exposed. At this time, it is preferable that the etching process is performed such that the remained isolation layer 126 is higher than a surface of the semiconductor substrate 100 in the active area to improve a cycling characteristic to the tunnel insulating layer 102.

In the embodiment, in the meantime, although the etching process for adjusting the effective field height (EFH) is performed after removing the isolation nitride layer 108, the present invention is not limited thereto. That is, the process for removing the isolation nitride layer 108 may be carried out after an etching process for adjusting is the effective field height (EFH) is completed.

The present invention has at least the advantages as follows.

Firstly, when the isolation layer is formed by the high density plasma (HDP) oxide layer, the moat caused by the high density plasma (HDP) deposition characteristic is uniformly filled with the oxide layer formed by the low pressure chemical vapor deposition (LPCVD) method to reduce a lower step coverage and a topology, and so the factor causing a generation of void is eliminated in advance. As a result, it is possible to inhibit voids from being generated in the subsequent deposition process so that a loss of a side wall of the conductive layer for a gate in the subsequent wet etching process can be prevented.

Secondly, after the moat is filled with the oxide layer formed by the lower pressure chemical vapor deposition (LPCVD) method, the etching process is performed to remain the lower pressure chemical vapor deposition (LPCVD) oxide layer in the form of a spacer. Accordingly, a sufficient space and slope can be secured during a subsequent gap fill process to prevent a defect from being generated.

Thirdly, it is possible to prevent a cell coupling ratio from be reduced by preventing a loss of a side wall of the conductive layer for a gate, so that a lowering of an operating characteristic of the device can be prevented.

Fourthly, although the patterns of the semiconductor will continuously become minuter from now on, there is no need to utilize new equipment and the isolation layer having excellent characteristics can be formed by conventional equipment so that it is possible to save a cost for the equipment investment.

Although embodiments have been described with reference to a number of illustrative embodiments thereof, numerous modifications and embodiments can be devised by that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be possible.

What is claimed is:

1. A method of forming an isolation layer in a semiconductor device, comprising:
    forming a trench on an isolation region of a semiconductor substrate by etching utilizing an isolation mask;
    forming a first insulating layer on a lower portion of the trench;
    forming a second insulating layer on the semiconductor substrate including the first insulating layer;
    forming a third insulating layer on a peripheral region of the second insulating layer to fill moats formed on the second insulating layer with the third insulating layer;
    forming a fourth insulating layer on the semiconductor substrate including the third insulating layer after forming the third insulating layer; and
    performing a planarization process such that the third and fourth insulating layers remain only on a region on which the trench is formed, thereby forming an isolation layer.

2. The method of claim 1, wherein at least one said etching comprises wet etch-back process.

3. The method of claim 2, comprising forming the second insulating layer such that a thickness of the second insulating layer formed on a side wall of the trench adjacent to an edge region is smaller than the thickness of the second insulating layer formed on a central region of the semiconductor substrate, wherein the second insulating layer is inclined and asymmetrically formed.

4. The method of claim 1, comprising forming the third insulating layer of an oxide layer by a low pressure chemical vapor deposition method.

5. The method of claim 4, comprising forming the oxide layer of a high temperature oxide (HTO) layer or a tetra ethyl ortho silicate (TEOS) layer.

6. The method of claim 1, comprising forming a conductive layer on an active area of the semiconductor substrate, wherein the third insulating layer remains in the form of a spacer on side walls of the conductive layer.

7. The method of claim 1, wherein forming the third insulating layer comprises:
    forming the third insulating layer on the first and second insulating layers through a low pressure chemical vapor deposition method to fill moats formed on the second insulating layer with the third insulating layer; and
    etching the third insulating layer such that the third insulating layer remains in the form of a spacer.

8. The method of claim 1, wherein the first insulating layer comprises a stack layer comprising a high density plasma (HDP) oxide layer and a polysilazane (PSZ) layer.

9. The method of claim 1, wherein the first insulating layer comprises a stack layer comprising a high temperature oxide (HTO) layer and a polysilazane (PSZ) layer.

10. The method of claim 8, wherein forming the first insulating layer comprises:
    forming the HDP oxide layer on the semiconductor substrate including the trench to fill a portion of the trench with the HDP oxide layer;
    forming the PSZ layer on the HDP oxide layer to fill the trench with the PSZ layer;
    performing a planarizing process such that the HDP oxide layer and the PSZ layer remain only on the trench; and
    etching the PSZ layer to reduce the height of the PSZ layer.

11. The method of claim 10, comprising forming the PSZ layer by coating and then curing PSZ material.

12. The method of claim 11, comprising curing the PSZ material by a mixed method of steam annealing and nitrogen ($N_2$) annealing.

13. The method of claim 10, further comprising the step of curing the planarized PSZ layer before etching the PSZ to reduce the height of the PSZ layer.

14. The method of claim 13, comprising curing the planarized PSZ layer by a mixed method of steam annealing and nitrogen ($N_2$) annealing.

15. The method of claim 9, comprising forming the first insulating layer by:
    forming the HTO layer on the semiconductor substrate including the trench to fill a portion of the trench with the HTO layer;
    forming the PSZ layer on the HTO layer to fill the trench with the PSZ layer;
    performing a planarizing process such that the HTO layer and the PSZ layer remain only on the trench; and
    etching the PSZ layer to reduce the height of the PSZ layer.

16. The method of claim 15, comprising forming the PSZ layer by coating and then curing PSZ material.

17. The method of claim 16, comprising curing the PSZ material by a mixed method of steam annealing and nitrogen ($N_2$) annealing.

18. The method of claim 15, further comprising curing the planarized PSZ layer before etching the PSZ layer to reduce the height of the PSZ layer.

19. The method of claim 18, comprising curing the planarized PSZ layer by a mixed method of steam annealing and nitrogen ($N_2$) annealing.

20. The method of claim 1, further comprising etching the third insulating layer to secure a space in the trench after forming the third insulating layer.

21. The method of forming an isolation layer in a semiconductor device of claim 1, further comprising:
    removing the isolation mask; and
    etching the isolation layer to adjust the effective field height (EFH).

22. The method of claim 21, wherein, when the isolation mask is removed, the third insulating layer remains in the form of a spacer on a side wall of a conductive layer formed on an active area of the semiconductor substrate to protect the side wall of the conductive layer.

23. A method of forming an isolation layer in a semiconductor device, comprising:
    providing a semiconductor substrate in which a trench is formed on an isolation region and a multi-layered layer including a tunnel insulating layer and a conductive layer is formed on an active region;
    forming a first insulating layer on a lower portion of the trench;
    forming a second insulating layer on the semiconductor substrate including the first insulating layer;
    forming a third insulating layer on a peripheral region of the second insulating layer to fill moats formed on the second insulating layer with the third insulating layer;
    forming a fourth insulating layer on the semiconductor substrate including the third insulating layer after forming the third insulating layer; and
    performing a planarization process such that the third and fourth insulating layers remain only on a region on which the trench is formed, thereby forming an isolation layer.

24. The method of claim 23, comprising forming the third insulating layer of an oxide layer by a low pressure chemical vapor deposition method.

25. The method of claim 24, comprising forming the oxide layer of a high temperature oxide (HTO) layer or a tetra ethyl ortho silicate (TEOS) layer.

26. The method of claim 23, wherein, the third insulating layer remains in the form of a spacer on a side wall of the conductive layer to protect the side wall of the conductive layer.

27. The method of claim 1, comprising forming the second insulating layer of a high density plasma (HDP) oxide layer.

* * * * *